(12) United States Patent
Okuni et al.

(10) Patent No.: US 12,438,539 B2
(45) Date of Patent: Oct. 7, 2025

(54) ELECTRONIC APPARATUS, SWITCHING SYSTEM, AND CONTROL METHOD

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Hidenori Okuni, Yokohama Kanagawa (JP); Takafumi Sakamoto, Tokyo (JP); Masaki Nishikawa, Yokohama Kanagawa (JP); Koji Akita, Yokohama Kanagawa (JP)

(73) Assignees: KABUSHIKI KAISHA TOSHIBA, Kawasaki (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 291 days.

(21) Appl. No.: 18/181,585

(22) Filed: Mar. 10, 2023

(65) Prior Publication Data

US 2024/0072793 A1 Feb. 29, 2024

(30) Foreign Application Priority Data

Aug. 31, 2022 (JP) .................. 2022-138784

(51) Int. Cl.
*H03K 17/56* (2006.01)
*H02P 27/08* (2006.01)
(52) U.S. Cl.
CPC ............. *H03K 17/56* (2013.01); *H02P 27/08* (2013.01)

(58) Field of Classification Search
CPC ........ H03K 17/56; H02P 27/08; H02M 1/007; H02M 1/44; H02M 7/5387; H02M 7/5395; H02S 50/00
See application file for complete search history.

(56) References Cited

U.S. PATENT DOCUMENTS

| 10,061,957 B2 | 8/2018 | Yoscovich et al. |
| 10,200,906 B2 | 2/2019 | Damnjanovic et al. |
| 2017/0115119 A1 | 4/2017 | Chapman et al. |

(Continued)

FOREIGN PATENT DOCUMENTS

| CN | 103762937 A | 4/2014 |
| CN | 107153212 A | 9/2017 |
| CN | 109691201 B | 9/2020 |

(Continued)

OTHER PUBLICATIONS

"Power Electronics", Osaka Prefecture University Technical Junior College, Electronic Information Course. Accessed at http://www2-kawakami.ct.osakafu-u.ac.jp/lecture/power_electronics/.

(Continued)

*Primary Examiner* — Metasebia T Retebo
(74) *Attorney, Agent, or Firm* — Holtz, Holtz & Volek PC

(57) ABSTRACT

An electronic apparatus includes processing circuitry configured to generate first control information about timing with which a first switching control device performs switching control and second control information about timing with which a second switching control device performs switching control based on location information on the first switching control device and location information on the second switching control device.

18 Claims, 11 Drawing Sheets

(56) References Cited

U.S. PATENT DOCUMENTS

2022/0020887 A1    1/2022  Yoscovich et al.

FOREIGN PATENT DOCUMENTS

| | | | |
|---|---|---|---|
| JP | 2011172306 A | * | 9/2011 |
| JP | 5047829 B2 | | 7/2012 |
| JP | 2015027236 A | | 2/2015 |
| JP | 6211336 B2 | | 9/2017 |
| JP | 2018088750 A | | 6/2018 |
| JP | 2021101591 A | | 7/2021 |
| JP | 2021145447 A | | 9/2021 |
| JP | 2022037310 A | | 3/2022 |
| WO | WO-2018166577 A1 | * | 9/2018 |

OTHER PUBLICATIONS

"22. DC-AC Interverter (6)", PowerPoint Lecture, Osaka Prefecture University Technical Junior College, Electronic Information Course, http://www2-kawakami.ct.osakafu-u.ac.jp/omu-content/uploads/sites/1161/Lecture_Data/Power_Electronics/01_Lecture/22_lecture_power_electronics.pdf.

Zhang, et al., "Synchronous random switching frequency modulation technique based on the carrier phase shift to reduce the PWM noise", IET Power Electronics.

* cited by examiner

|  | SWITCHING CONTROL DEVICE | | | |
|---|---|---|---|---|
| | 3_1 | 3_2 | ··· | 3_N |
| 3_1 | — | 0.2km | ··· | 20.0km |
| 3_2 | 0.2km | — | ··· | 20.2km |
| ⋮ | ⋮ | ⋮ | ⋮ | ⋱ |
| 3_N | 20.0km | 20.2km | ··· | — |

(row header: SWITCHING CONTROL DEVICE)

FIG. 3

|  | | SWITCHING CONTROL DEVICE | | | | | |
|---|---|---|---|---|---|---|---|
|  | | 3_1 | 3_2 | 3_3 | 3_4 | 3_5 | 3_6 |
| SWITCHING CONTROL DEVICE | 3_1 | — | 0.2km | 20.0km | 0.1km | 0.2km | 20.5km |
| | 3_2 | 0.2km | — | 20.2km | 0.2km | 0.1km | 20.6km |
| | 3_3 | 20.0km | 20.2km | — | 20.3km | 20.4km | 0.4km |
| | 3_4 | 0.1km | 0.2km | 20.3km | — | 0.3km | 20.5km |
| | 3_5 | 0.2km | 0.1km | 20.4km | 0.3km | — | 20.6km |
| | 3_6 | 20.5km | 20.6km | 0.4km | 20.5km | 20.6km | — |

FIG. 10

| SWITCHING CONTROL DEVICE | CARRIER FREQUENCY |
|---|---|
| 3_4 | f1 |
| 3_5 | f1 |
| 3_6 | f2 |

FIG. 11

ELECTRONIC APPARATUS, SWITCHING SYSTEM, AND CONTROL METHOD

CROSS REFERENCE TO RELATED APPLICATIONS

This application is based upon and claims the benefit of priority from the prior Japanese Patent Application No. 2022-138784, filed on Aug. 31, 2022, the entire contents of which are incorporated herein by reference.

FIELD

One embodiment of the present invention relates to an electronic apparatus, a switching system, and a control method.

BACKGROUND

In a servo control system that drives and controls a multi-axis motor with a plurality of inverters, a technology to suppress switching noise by using carrier frequencies different from each other for the plurality of inverters is known.

However, there is a problem that the number of available carrier frequencies is limited, and if the number of inverters exceeds the maximum number of available carrier frequencies, the same carrier frequency needs to be used by two or more inverters, leading to an increase in electromagnetic noise.

BRIEF DESCRIPTION OF THE DRAWINGS

FIG. 3 is a diagram showing one example of a distance between arbitrary two switching control devices;

FIG. 10 is a diagram showing a distance between arbitrary two switching control devices; and FIG. 11 is a diagram showing carrier frequencies included in estimated control parameters of the switching control device.

DETAILED DESCRIPTION

To solve the above-described problem, according to one embodiment of the present invention, an electronic apparatus including processing circuitry configured to generate first control information about timing with which a first switching control device performs switching control and second control information about timing with which a second switching control device performs switching control based on location information on the first switching control device and location information on the second switching control device is provided.

Embodiments of an electronic apparatus, a switching system, and a control method will be described below with reference to the drawings. Although main components of the electronic apparatus and the switching system will be mainly described below, there may be components or functions that are not illustrated or described. The following description does not exclude components or functions that are not illustrated or described.

Figure 1:
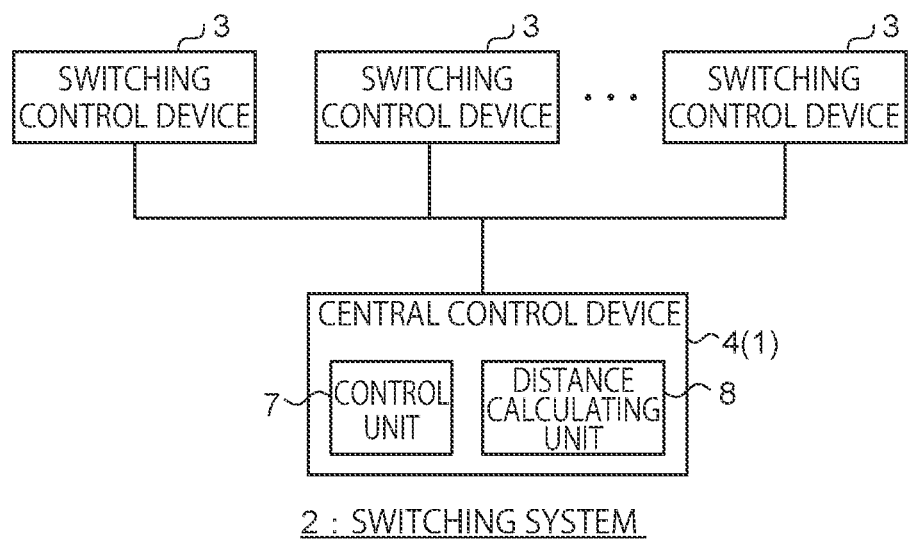
FIG. 1 is a block diagram showing a schematic configuration of an electronic apparatus and a switching system according to a first embodiment.

(First embodiment) FIG. 1 is a block diagram showing a schematic configuration of an electronic apparatus 1 and a switching system 2 according to a first embodiment. The switching system 2 of FIG. 1 includes a plurality of switching control devices 3 and a central control device 4. The central control device 4 of FIG. 1 corresponds to the electronic apparatus 1 according to the first embodiment. In this specification, the central control device 4 is referred to as an electronic apparatus in some cases.

Figure 2:
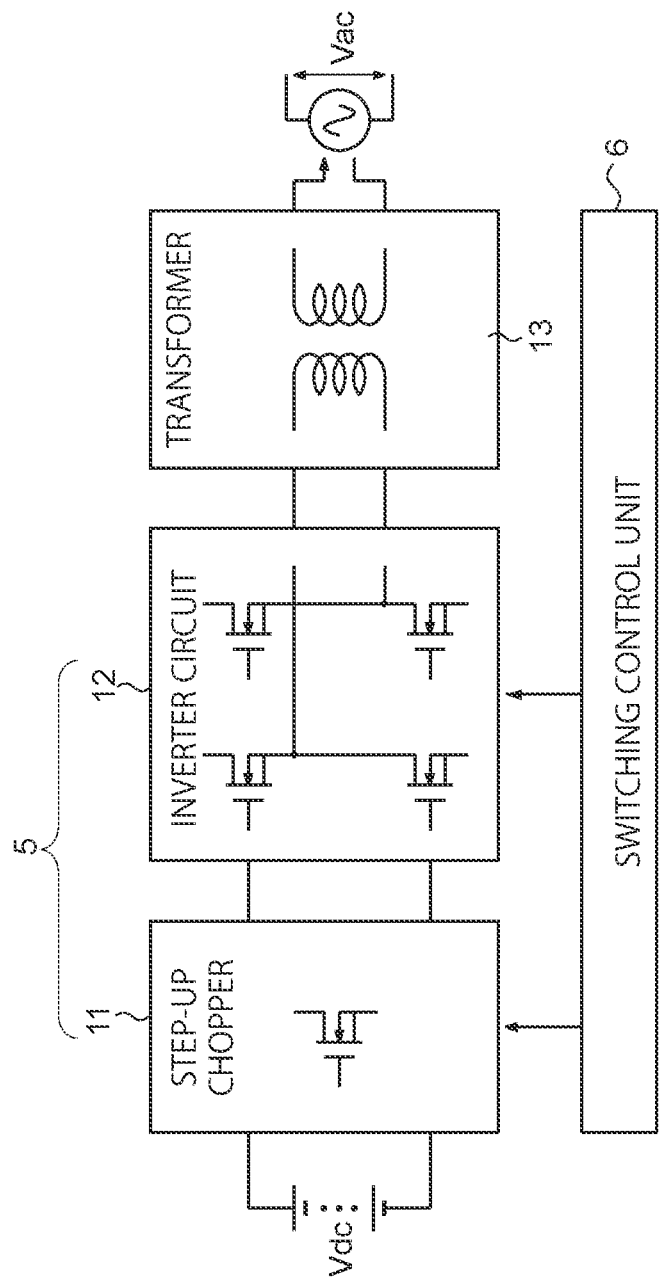
FIG. 2 is a detailed block diagram of a switching control device shown in FIG. 1.

Each of the plurality of switching control devices 3 includes a switching unit 5 and a switching control unit 6 as shown in FIG. 2 described later.

The switching unit 5 includes one or more switching elements and performs a switching operation to turn on or off the switching elements with predetermined timing. In more detail, the switching unit 5 includes an inverter, a converter, a transformer, and the like, and converts DC/AC, converts voltage, current, frequency, number of phases, and the like with power loss suppressed. The switching elements described above are provided, for example, in the inverter or converter.

The switching control device 3 is, for example, a power conversion device that converts a DC voltage generated by a renewable energy power generation facility such as a photovoltaic (PV) device into an AC voltage. This type of power conversion device is also referred to as a power conditioner (PCS: power conditioning subsystem). Note that the power conversion device can have a mode for converting a DC voltage into an AC voltage and a mode for converting an AC voltage into a DC voltage.

FIG. 2 is a detailed block diagram of the switching control device 3 shown in FIG. 1. All of the plurality of switching control devices 3 shown in FIG. 1 have the same internal configuration as in FIG. 2. As shown in FIG. 2, the switching control device 3 includes, for example, the switching unit 5 that converts a DC voltage generated by a renewable energy power generation facility into an AC voltage and the switching control unit 6.

As shown in FIG. 2, the switching control device 3 includes a step-up chopper circuit 11, an inverter circuit 12, a transformer 13, and the switching control unit 6. The step-up chopper circuit 11 and the inverter circuit 12 constitute the switching unit 5.

The step-up chopper circuit 11 converts the voltage amplitude of the input DC voltage. The inverter circuit 12 converts the output voltage of the step-up chopper circuit 11 into an AC voltage. The inverter circuit 12 turns on or off the switching unit 5 based on a PWM signal generated using a carrier signal and an instruction signal to be described later, thereby generating an AC voltage. The transformer 13 converts the voltage amplitude of the AC voltage to generate a commercial power supply voltage of 100 V. The switching control unit 6 controls the step-up chopper circuit 11 and the inverter circuit 12. The switching control unit 6 may be a semiconductor chip or a discrete digital circuit component that performs digital signal processing such as a central processing unit (CPU) or digital signal processor (DSP), or may be a semiconductor chip or a discrete component that performs analog signal processing.

Each of the plurality of switching control devices 3 shown in FIG. 1 performs switching control to turn on or off the corresponding switching unit 5 with predetermined timing. Each of the switching control devices 3 can perform switching control on the corresponding switching unit 5 individually. The number of switching control devices 3 in the switching system 2 is required at least to be two or more, and the number of switching control devices 3 is arbitrary. In this specification, arbitrary two of the plurality of switching control devices 3 are referred to as a first switching control device 3_1 and a second switching control device 3_2.

The central control device 4 generates control information about timing with which the plurality of switching control devices 3 performs the switching operation based on location information on the plurality of switching control devices 3, and supplies the control information to each switching control device 3. The central control device 4 includes a control unit 7 that generates the control information described above.

For example, when the first switching control device 3_1 and the second switching control device 3_2 are connected to the central control device 4, the control unit 7 in the central control device 4 generates first control information about timing with which the first switching control device 3_1 performs switching control and second control information about timing with which the second switching control device 3_2 performs switching control based on the location information on the first switching control device 3_1 and the location information on the second switching control device 3_2. The control unit 7 supplies the first control information to the first switching control device 3_1 and supplies the second control information to the second switching control device 3_2. The first switching control device 3_1 performs switching control on the switching unit 5 in the first switching control device 3_1 based on the first control information generated by the control unit 7. Similarly, the second switching control device 3_2 performs switching control on the switching unit 5 in the second switching control device 3_2 based on the second control information generated by the control unit 7.

Each switching control device 3 of FIG. 1 can be a noise source because the switching operation is performed. For example, in a case where N switching control devices 3 are disposed close to each other and the electromagnetic noise generated by the switching operation of respective switching control devices 3 is uncorrelated, the sum of the electromagnetic noise generated by the switching control devices 3 will be N times. Meanwhile, in a case where switching timing of N switching control devices 3 is identical and the waveform shape (frequency characteristics) of the electromagnetic noise generated by the switching operation is also identical, the correlation value of the electromagnetic noise generated by the switching operation of the switching control devices 3 is 1, enhancing the electromagnetic noise N×N-fold. In this way, when the timing of the switching operation agrees and the waveform shape of the electromagnetic noise by the switching operation (frequency characteristics) agrees, a noise enhancement effect of interference and mutual intensification of the electromagnetic noise is produced.

The central control device 4 according to the present embodiment generates the control information about the timing with which each switching control device 3 performs switching control in order to prevent the electromagnetic noise generated by the plurality of switching control devices 3 from being increased by the noise enhancement effect. In this specification, the control information generated by the central control device 4 is sometimes referred to as control parameters.

The central control device 4 generates control parameters different from each other for two or more switching control devices 3 that may produce the noise enhancement effect among the plurality of switching control devices 3.

The central control device 4 may include a distance calculating unit 8. The distance calculating unit 8 calculates the distance between the first switching control device 3_1 and the second switching control device 3_2 based on the location information on the first switching control device 3_1 and the location information on the second switching control device 3_2. In this case, the control unit 7 in the central control device 4 generates the first control information (first control parameter) and the second control information (second control parameter) based on the distances calculated by the distance calculating unit 8. More specifically, when the distance calculated by the distance calculating unit 8 exceeds a predetermined limit distance, the control unit 7 makes the first control parameter equal to the second control parameter, and when the distance calculated by the distance calculating unit 8 does not exceed the predetermined limit distance, the control unit 7 makes the first control parameter and the second control parameter different from each other.

FIG. 3 is a diagram showing one example of the distance between arbitrary two switching control devices 3 among N switching control devices 3 in the switching system 2. In the example of FIG. 3, the distance between the switching control device 3_1 and the switching control device 3_2 is 0.2 km, the distance between the switching control device 3_1 and the switching control device 3_N is 20.0 km, and the distance between the switching control device 3_2 and the switching control device 3_N is 20.2 km.

The central control device 4 sets control parameters different from each other for the switching control device 3_1 and the switching control device 3_2 with a short distance, and sets the same control parameter for the switching control device 3_2 and the switching control device 3_N with a long distance.

Because of the long distance between the switching control device 3_2 and the switching control device 3_N, even if the same control parameter is set, there is no risk of the electromagnetic noise generated by each switching control device 3 strengthening each other. That is, since the electromagnetic noise decays with distance, even if the generation timing and noise waveform of the electromagnetic noise generated by two switching control devices 3 with a long distance agree, there is no risk that the combined electromagnetic noise will interfere and strengthen each other.

Meanwhile, if the same control parameter is set for two switching control devices 3 with a short distance, since the electromagnetic noise is generated with the same timing, the electromagnetic noise strengthens each other, generating large electromagnetic noise. Therefore, the central control device 4 sets control parameters different from each other for the two switching control devices 3 with a short distance.

In this way, the control unit 7 in the central control device 4 sets the control parameter for each switching control device 3 according to the distance between arbitrary two switching control devices 3 out of the plurality of switching control devices 3, thereby making it possible to weaken the influence of the electromagnetic noise.

Even if the number of control parameters that can be generated by the control unit 7 is limited, since the same control parameter can be set for two switching control devices 3 with a long distance, the total number of control parameters set by the control unit 7 can be reduced.

The propagation loss L [dB] in free space at the distance d is represented by the following Formula (1), where c represents the speed of light, that is, the speed of electromagnetic waves, f represents the frequency of power supply noise, and λ represents the wavelength of electromagnetic waves.

$$L = 10 \log\left(\frac{4\pi d}{\lambda}\right)^2 = 20 \log\left(\frac{4\pi df}{c}\right) \quad (1)$$

In Formula (1), the propagation loss L becomes 3 [dB] when the transmission power becomes 0.5 times. The propagation loss L becomes 6 [dB] when the transmission power becomes 0.25 times. The propagation loss L becomes 10 [dB] when the transmission power becomes 0.1 times. The propagation loss L becomes 20 [dB] when the transmission power becomes 0.01 times.

Figure 4:
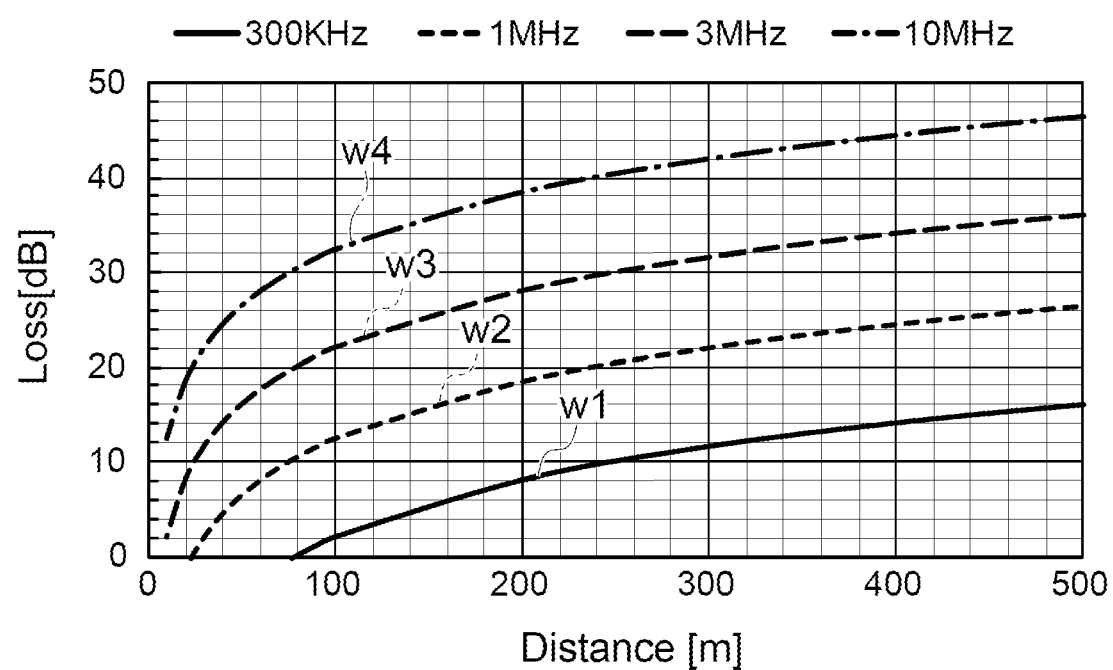
FIG. 4 is a diagram showing a relationship between the distance obtained from Formula (1) and a propagation loss.

FIG. 4 is a diagram showing the relationship between the distance d and the propagation loss L obtained from Formula (1). FIG. 4 illustrates four waveforms w1 to w4 of four frequencies f=300 kHz, 1 MHz, 3 MHz, and 10 MHz, which are frequency components of power supply noise. At any frequency, the propagation loss L increases as the distance increases.

By transforming Formula (1) into a Formula in which the transmission power increases by a factor of k, the following Formula (2) is obtained.

$$k = \left(\frac{c}{4\pi df}\right)^2 \quad (2)$$

When Formula (2) is solved for the distance d, the following Formula (3) is obtained.

$$d = \frac{c}{4\pi f \sqrt{k}} \quad (3)$$

The control unit 7 in the central control device 4 sets the distance d calculated by Formula (3) as the predetermined limit distance, and determines whether the distance between two switching control devices 3 exceeds the predetermined limit distance. K is, for example, 0.25. When the two switching control devices 3 perform the switching operation with the same timing and have the same electromagnetic noise waveform shape by the switching operation, the electromagnetic noise becomes 2×2=4 times because of the noise enhancement effect. However, if k=0.25, the transmission power of the two switching control devices 3 is ¼. Therefore, even if the noise enhancement effect is produced, there is no risk that the level of the original electromagnetic noise will be exceeded.

In this way, when the distance between the two switching control devices 3 exceeds the limit distance obtained by Formula (3) with k=0.25, even if these two switching control devices 3 have the same timing and the electromagnetic noise waveform shape caused by the switching operation is the same, it is considered that no noise enhancement effect will be produced.

Each of the plurality of switching control devices 3 shown in FIG. 1 is applied to, for example, the power conversion device including the switching unit 5, but the plurality of power conversion devices does not necessarily have the same power conversion capacity. As the power conversion capacity of the power conversion device increases, the electromagnetic noise generated by the switching control device 3 increases. Therefore, the control unit 7 in the central control device 4 preferably takes into account not only the location information on each switching control device 3 but also the power conversion capacity to set the control parameters.

Figure 5:
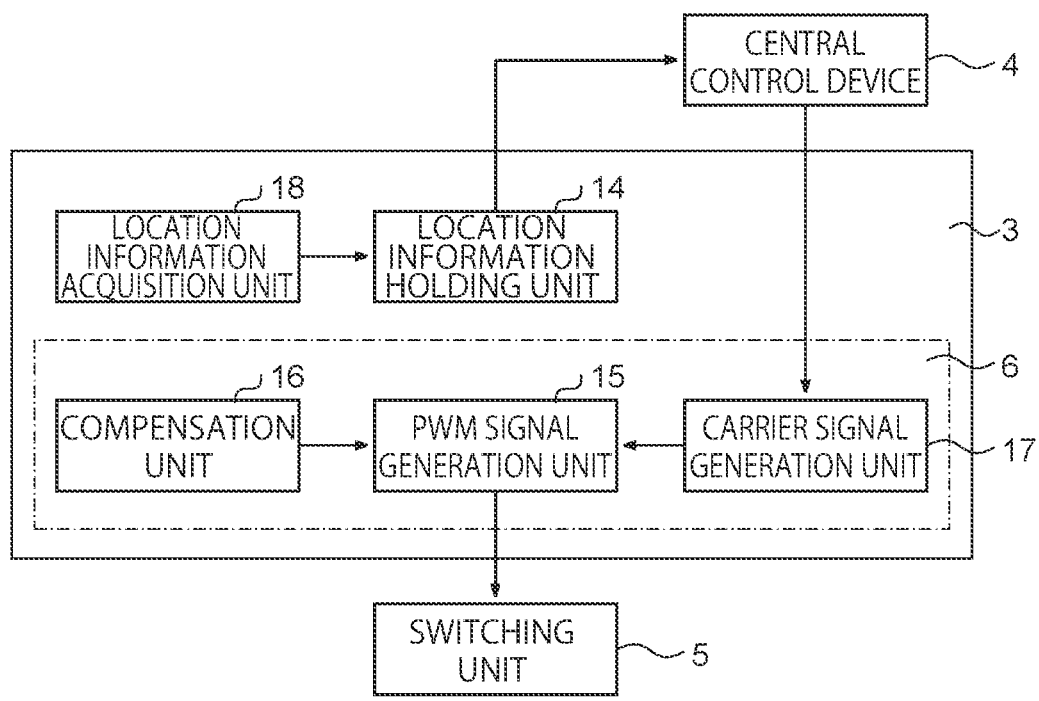
FIG. 5 is a block diagram showing an internal configuration of each switching control device of FIG. 1.

FIG. 5 is a block diagram showing the internal configuration of each switching control device 3 of FIG. 1. As shown in FIG. 5, each switching control device 3 includes the switching control unit 6 and a location information holding unit 14. The switching control unit 6 includes a pulse width modulation (PWM) signal generation unit 15, a compensation unit 16, and a carrier signal generation unit 17.

The PWM signal generation unit 15 generates a PWM signal for turning on or off the switching unit 5. As described later, the PWM signal generation unit 15 generates the PWM signal by comparing the relationship in terms of size between the carrier signal generated by the carrier signal generation unit 17 and the instruction signal generated by the compensation unit 16.

The compensation unit 16 generates a compensation value such that the AC signal output from the switching unit 5 agrees with a target signal, and generates the instruction signal based on the compensation value. The instruction signal is input into the PWM signal generation unit 15.

The carrier signal generation unit 17 generates the carrier signal based on the control parameter from the central control device 4. For example, the carrier signal generation unit 17 generates the carrier signal having at least one of the frequency or phase according to the control parameter. The control parameter may include a signal obtained by modulating the carrier frequency, which is the frequency of the carrier signal. The central control device 4 may update the control parameter at preset time intervals. The carrier signal is, for example, a triangular wave signal. Note that the carrier signal may be a saw wave signal, a sine wave signal, a square wave signal, or the like, and can have any waveform shape. The carrier signal generated by the carrier signal generation unit 17 is input into the PWM signal generation unit 15.

The carrier signal generation unit 17 may not only control at least one of the frequency or phase of the carrier signal, but also control the waveform shape or signal amplitude of the carrier signal based on the control parameter.

The location information holding unit 14 holds the location information on the switching control device 3. The location information holding unit 14 transmits the held location information to the central control device 4.

In addition, the switching control device 3 may include a location information acquisition unit 18. The location information acquisition unit 18 acquires the location information on the switching control device 3 by some means. The acquired location information is held by the location information holding unit 14.

The location information acquisition unit 18 may, for example, receive a radio wave from the global navigation satellite system (GNSS) to acquire the location information.

Alternatively, the location information acquisition unit 18 may acquire the location information that is input by an operator or the like during the installation of the switching control device 3. Alternatively, the location information acquisition unit 18 may acquire the location information that is input into the central control device 4 without going through the control device 3.

Figure 6:
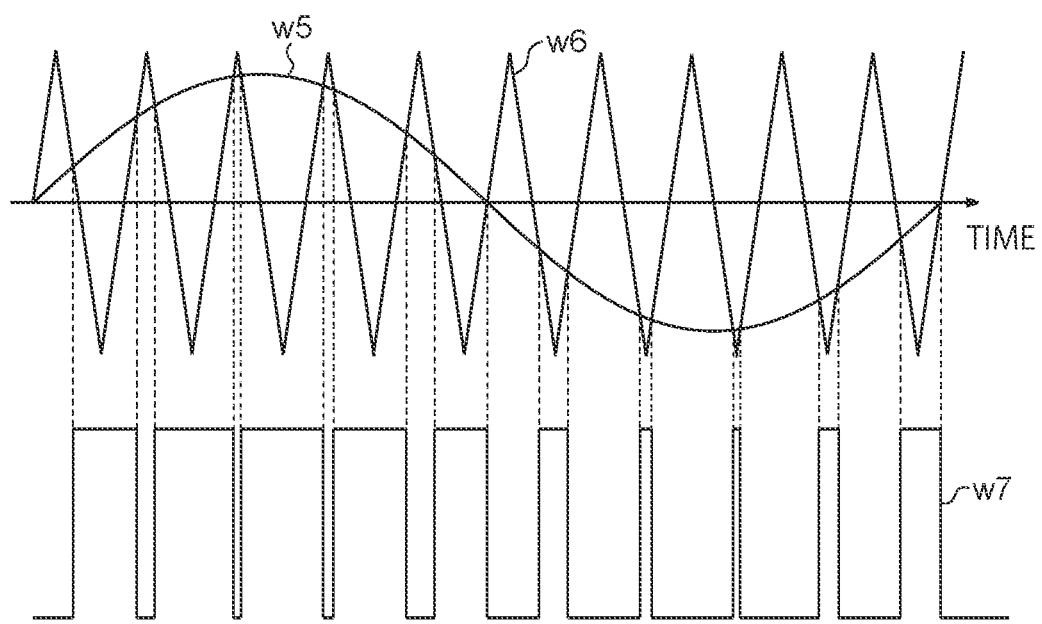
FIG. 6 is a timing chart describing a processing operation of a PWM signal generation unit.

FIG. 6 is a timing chart describing a processing operation of the PWM signal generation unit 15. The instruction signal w5 generated by the compensation unit 16 has the same degree of frequency as the frequency of the AC signal output by the switching unit 5 (for example, 50 Hz to 60 Hz). The carrier signal w6 generated by the carrier signal generation unit 17 is a signal having a much higher frequency than the instruction signal w5, for example, a triangular wave signal. The PWM signal generation unit 15 sets the PWM signal W7 to a high level, for example, when the signal amplitude of the instruction signal w5 is greater than the signal amplitude of the carrier signal w6, and sets the PWM signal W7 to a low level when the signal amplitude of the instruction signal w5 is equal to or less than the signal amplitude of the carrier signal w6. This generates the PWM signal W7 with a varying pulse width, as shown in FIG. 6.

The PWM signal W7 is used to control switching timing of on or off of the switching unit 5. By controlling at least one of the frequency or phase of the carrier signal w6, the central control device 4 can control the pulse width of the PWM signal W7. This makes it possible to control the timing with which the switching unit 5 performs the switching operation and to control the timing with which the electromagnetic noise is generated.

Figure 7:
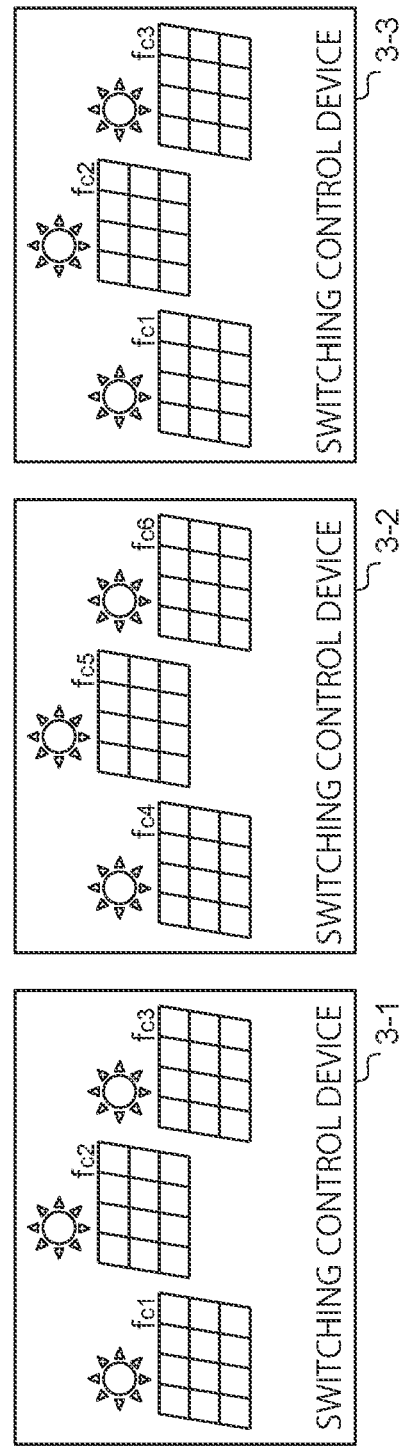
FIG. 7 is a diagram showing one specific example of the switching system according to the first embodiment.
Figure 8:
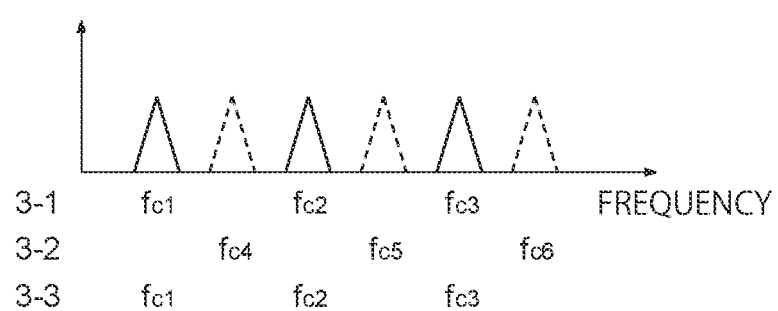
FIG. 8 is a diagram showing control parameters used by each switching control device of FIG. 7.

FIGS. 7 and 8 are diagrams showing one specific example of the switching system 2 according to the first embodiment. FIG. 7 shows an example in which there are three switching control devices 3_1, 3_2, and 3_3 in the switching system 2, and each of the switching control devices 3_1 to 3_3 controls the switching operation of three switching units. The central control device 4 acquires the location information on the three switching control devices 3_1 to 3_3, supplies control parameters that are different from each other to the two switching control devices disposed close to each other (3_1 and 3_2), (3_2 and 3_3), and supplies the same control parameter to the two switching control devices that are far apart (3_1 and 3_3). For example, as shown in FIG. 8, the central control device generates the control parameter such that three switching units controlled by the switching control device 3_1 perform the switching operation at carrier frequencies fc1, fc2, and fc3 different from one another. The central control device generates the control parameter such that three switching units controlled by the switching control device 3_2 perform the switching operation at carrier frequencies fc4, fc5, and fc6 different from one another. The central control device generates the control parameter such that three switching units controlled by the switching control device 3_3 perform the switching operation at carrier frequencies fc1, fc2, and fc3 different from one another. Since the switching control devices 3_1 and 3_3 use the same control parameter, the total number of control parameters can be reduced.

In this way, in the first embodiment, the central control device 4 connected to the plurality of switching control devices 3 generates the control parameter for each of the switching control devices 3 based on the location information on the plurality of switching control devices 3. This prevents the risk of the electromagnetic noise generated in each switching control device 3 enhancing each other. In particular, the central control device 4 calculates the distance between arbitrary two switching control devices 3 out of the plurality of switching control devices 3, and switches whether to supply the same control parameter to the two switching control devices 3 or to supply control parameters different from each other depending on whether the distance exceeds the predetermined limit distance. This reliably prevents the noise enhancement effect with a small number of control parameters.

(Second embodiment) The first embodiment has shown an example in which the central control device 4 controls all the switching control devices 3 in the switching system 2. However, there may be another switching control device 3 that is not under the control and management of the central control device 4 near a plurality of switching control devices 3 controlled by the central control device 4.

Figure 9:
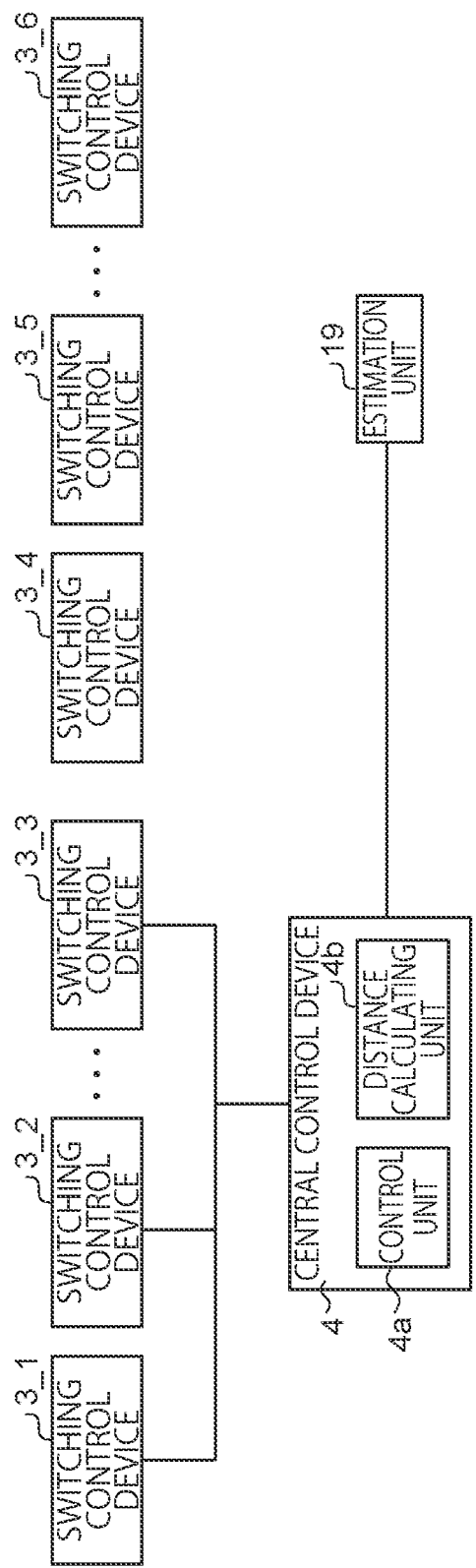
FIG. 9 is a block diagram showing a schematic configuration of a switching system according to a second embodiment.

FIG. 9 is a block diagram showing a schematic configuration of a switching system 2a according to the second embodiment. The switching system 2a of FIG. 9 includes a plurality of switching control devices 3_1, 3_2, and 3_3 under the control and management of the central control device 4, one or more external devices that are not under the control and management of the central control device 4, and an estimation unit 19. The external devices are noise sources whose noise pattern of some extent does not change, and are referred to herein and in FIG. 9 as switching control devices 3_4, 3_5, and 3_6.

The central control device 4 can control timing of switching control performed by the switching control devices 3_1, 3_2, and 3_3 by individually transmitting control parameters to the plurality of switching control devices 3_1, 3_2, and 3_3 under the control and management. Meanwhile, the central control device 4 cannot transmit control parameters to the switching control devices 3_4, 3_5, and 3_6 that are not under the control and management, and therefore cannot control the timing of the switching operation of the switching control devices 3_4, 3_5, and 3_6.

The number of switching control devices 3_1, 3_2, and 3_3 for which the central control device 4 can control the timing of the switching operation, and the number of switching control devices 3_4, 3_5, and 3_6 for which the central control device 4 cannot control the timing of the switching operation are arbitrary.

The estimation unit 19 estimates location information and control parameters of the switching control devices 3_4, 3_5 and 3_6 that are not under the control and management of the central control device 4. The control parameter to estimate is, for example, a frequency of a carrier signal of the switching control devices 3_4, 3_5 and 3_6 (hereafter, carrier frequency). The location information on the switching control devices 3_4, 3_5, and 3_6 can be acquired, for example, by receiving a radio wave from GNSS when measuring power supply noise.

The switching control devices 3_4, 3_5 and 3_6 generate the electromagnetic noise at the frequency near integral multiples of the carrier frequency. Therefore, the estimation unit 19 can measure the electromagnetic noise generated near the switching control devices 3_4, 3_5, and 3_6 to estimate the carrier frequency from the frequency characteristics of the waveform of the measured electromagnetic noise. The central control device 4 generates the control parameter for the switching control devices 3_1, 3_2 and 3_3 based on the location information on the switching control devices 3_4, 3_5, and 3_6 estimated by the estimation unit 19 and the carrier frequency used by the switching control devices 3_4, 3_5, and 3_6.

FIG. 10 is a diagram showing the distance between arbitrary two switching control devices 3 among the plurality of switching control devices 3 (3_1 to 3_6) in the switching system 2a of FIG. 9. FIG. 11 is a diagram showing the carrier frequencies included in the estimated control parameter of the switching control device 3 estimated by the estimation unit 19.

The estimation result of FIG. 11 shows that the switching control devices 3_4 and 3_5 use the carrier frequency f1, whereas the switching control device 3_6 uses the carrier frequency f2. Here, since the switching control device 3_3 is near the switching control device 3_6, the carrier frequency f1 different from the carrier frequency f2 of the switching control device 3_6 is set. Since the switching control device 3_1 is near the switching control devices 3_4 and 3_5 and far from the switching control devices 3_3 and 3_6, the carrier frequency f2 different from the frequency of the switching control devices 3_4 and 3_5 and identical to the frequency of the switching control device 3_6 is set. Since the switching control device 3_2 is near the switching control devices 3_1, 3_4, and 3_5, f3 different from these carrier frequencies is set.

In this way, in the second embodiment, when there are switching control devices 3_4 to 3_6 that are not under the control and management of the central control device 4, the estimation unit 19 estimates the location information and the control parameter of the switching control devices 3_4 to 3_6 and sends the estimated information to the central control device 4. With this operation, the central control device 4 controls the switching control device 3 located near the switching control devices 3_4 to 3_6 not to use the carrier frequency used by the switching control devices 3_4 to 3_6. With this operation, even when there are switching control devices 3_4 to 3_6 that are not under the control and management of the central control device 4, it is possible to prevent other switching control devices 3_1 to 3_3 from producing the noise enhancement effect and reduce the electromagnetic noise generated from the switching system 2a as a whole.

The above-described embodiments may be configured as follows.

(1) An electronic apparatus comprising:
processing circuitry configured to generate first control information about timing with which a first switching control device performs switching control and second control information about timing with which a second switching control device performs switching control based on location information on the first switching control device and location information on the second switching control device.

(2) The electronic apparatus according to (1), wherein
the processing circuitry is configured to determine the timing with which the first switching control device and the second switching control device perform the switching control based on the location information on the first switching control device and the location information on the second switching control device.

(3) The electronic apparatus according to claim (1) or (2), wherein
the processing circuitry is configured to supply the first control information to the first switching control device and supplies the second control information to the second switching control device.

(4) The electronic apparatus according to any one of (1) to (3), wherein
the processing circuitry is further configured to calculate a distance between the first switching control device and the second switching control device based on the location information on the first switching control device and the location information on the second switching control device,
the first control information and the second control information being generated based on the calculated distance.

(5). The electronic apparatus according to (4), wherein
when the calculated distance exceeds a predetermined limit distance, the processing circuitry makes the first control information equal to the second control information, and when the calculated distance does not exceed the predetermined limit distance, the processing circuitry makes the first control information and the second control information different from each other.

(6) The electronic apparatus according to (5), wherein
the processing circuitry is configured to calculate the predetermined limit distance d based on Formula (1) below, where c represents a speed of light, f represents a frequency of power supply noise, and a loss of transmission power is k times the transmission power.

$$d = \frac{c}{4\pi f \sqrt{k}} \quad (1)$$

(7) The electronic apparatus according to any one of (1) to (6), wherein
an estimator that estimates location information on a third switching control device that is not under control and management of the electronic apparatus and third control information about timing with which switching control of the third the switching control device is performed, wherein the processing circuitry generates the first control information and the second control information based on the location information on the third switching control device and the estimated third control information.

(8) The electronic apparatus according to (7), wherein
the estimator is configured to estimate the third control information based on a frequency that is an integral multiple of a carrier frequency of the third switching control device.

(9) The electronic apparatus according to any one of (1) to (8), wherein
the processing circuitry is configured to set the first control information and the second control information according to a frequency f of power supply noise in each of the first switching control device and the second switching control device to allow an amount of electromagnetic noise generated to satisfy a first condition, a second condition, a third condition, or a fourth condition below,
the first condition: 13.5 dBuA/m or less when 150 kHz≤f≤490 kHz, the second condition: 3.5 dBuA/m or less when 490 kHz<f≤3.95 MHz, the third condition: −11.5 dBuA/m or less when 3.95 MHz<f≤20 MHz, and the fourth condition: −21.5 dBuA/m or less when 20 MHz<f≤30 MHz.

(10) The electronic apparatus according to any one of (1) to (8), wherein
based on the location information on the first switching control device and the location information on the second switching control device, the processing circuitry is configured to control at least one of a frequency or phase of a first carrier signal used by the first switching control device for the switching control, and controls at least one of a frequency or phase of a second carrier signal used by the second switching control device for the switching control.

(11) The electronic apparatus according to (10), wherein the first control information includes information on at least one of the frequency or the phase of the first carrier signal, and the second control information includes information on at least one of the frequency or the phase of the second carrier signal.

(12) The electronic apparatus according to any one of (1) to (11), wherein
the processing circuitry is configured to generate the first control information based on a power conversion capacity of the first switching control device, and generate the second control information based on a power conversion capacity of the second switching control device.

(13) The electronic apparatus according to any one of (1) to (12), wherein
the first switching control device and the second switching control device perform switching control on a power conversion device that converts a DC voltage generated by a renewable energy power generation facility to an AC voltage.

(14) A switching system comprising:
a first switching control device that performs switching control on a first switching circuit;
a second switching control device that performs switching control on a second switching circuit; and
an electronic apparatus that generates first control information about timing with which the first switching control device performs the switching control and second control information about timing with which the second switching control device performs the switching control based on location information on the first switching control device and location information on the second switching control device,
wherein the first switching control device performs the switching control on the first switching circuit based on the first control information, and the second switching control device performs the switching control on the second switching circuit based on the second control information.

(15) The switching system according to (14), wherein
the first switching control device is further configured to hold the location information on the first switching control device,
the second switching control device is further configured to hold the location information on the second switching control device, and
the electronic apparatus generates the first control information and the second control information based on the location information held by the first switching control device and the second switching control device.

(16) The switching system according to (15), wherein
the first switching control device is further configured to acquire and hold the location information on the first switching control device, the second switching control device is further configured to acquire and hold the location information on the second switching control device.

(17) The switching system according to (16), wherein
the first switching control device and the second switching control device receive a radio wave from a global navigation satellite system (GNSS) to acquire the location information.

(18) The switching system according to (16), wherein
the first switching control device is configured to acquire the location information on the first switching control device when the first switching control device is installed, and the second switching control device is configured to acquire the location information on the second switching control device when the second switching control device is installed.

(19) The switching system according to any one of (14) to (18), further comprising:
a third switching control device that is not under control and management of the electronic apparatus; and
an estimator that estimates location information on the third switching control device and third control information about timing with which switching control on the third switching control device is performed, wherein the electronic apparatus generates the first control information and the second control information based on location information on the third switching control device and the estimated third control information.

(20) A control method comprising
generating first control information about timing with which a first switching control device performs switching control and second control information about timing with which a second switching control device performs switching control based on location information on the first switching control device and location information on the second switching control device.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:
1. An electronic apparatus comprising:
processing circuitry configured to:
generate first control information about timing with which a first switching control device performs switching control and second control information about timing with which a second switching control device performs switching control based on location information on the first switching control device and location information on the second switching control device,
calculate a distance between the first switching control device and the second switching control device based on the location information on the first switching control device and the location information on the second switching control device, the first control information and the second control information being generated based on the calculated distance,
when the calculated distance exceeds a predetermined limit distance, make the first control information equal to the second control information, and
when the calculated distance does not exceed the predetermined limit distance, makes the first control information and the second control information different from each other.

2. The electronic apparatus according to claim 1, wherein
the processing circuitry is configured to determine the timing with which the first switching control device and the second switching control device perform the switching control based on the location information on the first switching control device and the location information on the second switching control device.

3. The electronic apparatus according to claim 1, wherein the processing circuitry is configured to supply the first control information to the first switching control device and supplies the second control information to the second switching control device.

4. The electronic apparatus according to claim 1, wherein the processing circuitry is configured to calculate the predetermined limit distance d based on Formula (1) below, where c represents a speed of light, f represents a frequency of power supply noise, and a loss of transmission power is k times the transmission power $$d = \frac{c}{4\pi f \sqrt{k}}. \quad (1)$$

5. The electronic apparatus according to claim 1, further comprising:
an estimator that estimates location information on a third switching control device that is not under control and management of the control device and third control information about timing with which switching control of the third the switching control device is performed, wherein the processing circuitry generates the first control information and the second control information based on the location information on the third switching control device and the estimated third control information.

6. An electronic apparatus comprising:
processing circuitry configured to:
generate first control information about timing with which a first switching control device performs switching control and second control information about timing with which a second switching control device performs switching control based on location information on the first switching control device and location information on the second switching control device, and
estimate location information on a third switching control device that is not under control and management of the control device and third control information about timing with which switching control of the third the switching control device is performed,
wherein the processing circuitry generates the first control information and the second control information based on the location information on the third switching control device and the estimated third control information, and
wherein the processing circuitry is configured to estimate the third control information based on a frequency that is an integral multiple of a carrier frequency of the third switching control device.

7. The electronic apparatus according to claim 1, wherein the processing circuitry is configured to set the first control information and the second control information according to a frequency f of power supply noise in each of the first switching control device and the second switching control device to allow an amount of electromagnetic noise generated to satisfy a first condition, a second condition, a third condition, or a fourth condition below,
the first condition: 13.5 dBuA/m or less when 150 KHz≤f≤490 kHz, the second condition: 3.5 dBuA/m or less when 490 KHz<f≤3.95 MHz, the third condition: −11.5 dBuA/m or less when 3.95 MHz<f≤20 MHz, and the fourth condition: −21.5 dBuA/m or less when 20 MHz<f≤30 MHz.

8. The electronic apparatus according to claim 1, wherein based on the location information on the first switching control device and the location information on the second switching control device, the processing circuitry is configured to control at least one of a frequency or phase of a first carrier signal used by the first switching control device for the switching control, and controls at least one of a frequency or phase of a second carrier signal used by the second switching control device for the switching control.

9. The electronic apparatus according to claim 8, wherein the first control information includes information on at least one of the frequency or the phase of the first carrier signal, and the second control information includes information on at least one of the frequency or the phase of the second carrier signal.

10. The electronic apparatus according to claim 1, wherein
the processing circuitry is configured to generate the first control information based on a power conversion capacity of the first switching control device, and generate the second control information based on a power conversion capacity of the second switching control device.

11. The electronic apparatus according to claim 1, wherein
the first switching control device and the second switching control device perform switching control on a power conversion device that converts a DC voltage generated by a renewable energy power generation facility to an AC voltage.

12. A switching system comprising:
a first switching control device that performs switching control on a first switching circuit;
a second switching control device that performs switching control on a second switching circuit; and
an electronic apparatus that (i) generates first control information about timing with which the first switching control device performs the switching control and second control information about timing with which the second switching control device performs the switching control based on location information on the first switching control device and location information on the second switching control device, and (ii) calculates a distance between the first switching control device and the second switching control device based on the location information on the first switching control device and the location information on the second switching control device, the first control information and the second control information being generated based on the calculated distance,
wherein when the calculated distance exceeds a predetermined limit distance, the electronic apparatus makes the first control information equal to the second control information, and when the calculated distance does not exceed the predetermined limit distance, the electronic apparatus makes the first control information and the second control information different from each other, and
wherein the first switching control device performs the switching control on the first switching circuit based on the first control information, and the second switching control device performs the switching control on the second switching circuit based on the second control information.

13. The switching system according to claim 12, wherein
the first switching control device is further configured to hold the location information on the first switching control device,
the second switching control device is further configured to hold the location information on the second switching control device, and
the electronic apparatus generates the first control information and the second control information based on the location information held by the first switching control device and the second switching control device.

14. The switching system according to claim 13, wherein
the first switching control device is further configured to acquire and hold the location information on the first switching control device, the second switching control device is further configured to acquire and hold the location information on the second switching control device.

15. The switching system according to claim 14, wherein
the first switching control device and the second switching control device receive a radio wave from a global navigation satellite system (GNSS) to acquire the location information.

16. The switching system according to claim 14, wherein
the first switching control device is configured to acquire the location information on the first switching control device when the first switching control device is installed, and the second switching control device is configured to acquire the location information on the second switching control device when the second switching control device is installed.

17. The switching system according to claim 12, further comprising:

a third switching control device that is not under control and management of the electronic apparatus; and
an estimator that estimates location information on the third switching control device and third control information about timing with which switching control on the third switching control device is performed, wherein the electronic apparatus generates the first control information and the second control information based on location information on the third switching control device and the estimated third control information.

18. A control method comprising:
generating first control information about timing with which a first switching control device performs switching control and second control information about timing with which a second switching control device performs switching control based on location information on the first switching control device and location information on the second switching control device;
calculating a distance between the first switching control device and the second switching control device based on the location information on the first switching control device and the location information on the second switching control device, the first control information and the second control information being generated based on the calculated distance; and
performing control such that when the calculated distance exceeds a predetermined limit distance, the first control information is made to be equal to the second control information, and when the calculated distance does not exceed the predetermined limit distance, the first control information and the second control information are made to be different from each other.

\* \* \* \* \*